(12) United States Patent
Song

(10) Patent No.: US 8,922,248 B2
(45) Date of Patent: Dec. 30, 2014

(54) CLOCK CONTROL SIGNAL GENERATION USING TRANSITION OF THE CONTROL SIGNAL

(71) Applicant: SK hynix Inc., Gyeonggi-do (KR)

(72) Inventor: Choung-Ki Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 134 days.

(21) Appl. No.: 13/717,498

(22) Filed: Dec. 17, 2012

(65) Prior Publication Data

US 2013/0335115 A1  Dec. 19, 2013

(30) Foreign Application Priority Data

Jun. 13, 2012  (KR) .................. 10-2012-0063285

(51) Int. Cl.
*H03K 19/00* (2006.01)
*G05F 3/00* (2006.01)

(52) U.S. Cl.
CPC .............. *H03K 19/0005* (2013.01); *G05F 3/00* (2013.01)
USPC .............. 326/93; 327/160; 327/161; 327/299

(58) Field of Classification Search
CPC ............. H03K 19/0005; H03K 19/00361; H03K 3/0375; H04L 25/0278; H04L 25/0298; G11C 7/1051; G11C 7/1057; G06F 13/4086

USPC ............ 326/28, 29, 30; 327/63, 64, 176, 291, 327/299
See application file for complete search history.

(56) References Cited

U.S. PATENT DOCUMENTS

| | | | |
|---|---|---|---|
| 7,495,468 B2* | 2/2009 | You | 326/30 |
| 2009/0044039 A1* | 2/2009 | Lee | 713/600 |
| 2009/0302892 A1* | 12/2009 | Waldrop | 326/93 |
| 2011/0058437 A1* | 3/2011 | Miyano | 365/222 |
| 2011/0215838 A1* | 9/2011 | Yamaguchi | 327/64 |
| 2012/0081144 A1* | 4/2012 | Song | 326/30 |
| 2012/0212254 A1* | 8/2012 | Yokou et al. | 326/30 |
| 2013/0069689 A1* | 3/2013 | Song et al. | 326/30 |

FOREIGN PATENT DOCUMENTS

KR 100188670 6/1999
KR 1020110035749 4/2011

\* cited by examiner

*Primary Examiner* — Alexander H Taningco
*Assistant Examiner* — Kurtis R Bahr
(74) *Attorney, Agent, or Firm* — IP & T Group LLP

(57) ABSTRACT

A integrated circuit includes a clock control signal generation circuit configured to generate a clock control signal using transition of a control signal, a clock control unit configured to activate a control clock in an activated period of the clock control signal, and to deactivate the control clock in a deactivated period of the clock control signal, and a control circuit configured to operate in response to the control signal and in synchronization with the control clock.

16 Claims, 4 Drawing Sheets

CLOCK CONTROL SIGNAL GENERATION USING TRANSITION OF THE CONTROL SIGNAL

CROSS-REFERENCE TO RELATED APPLICATIONS

The present application claims priority of Korean Patent Application No. 10-2012-0063285, filed on Jun. 13, 2012, which is incorporated herein by reference in its entirety.

BACKGROUND

1. Field

Exemplary embodiments of the present invention relate to an integrated circuit and a method for operating the same, and more particularly, to controlling of a control signal having information at a transition point.

2. Description of the Related Art

Various integrated chips such as CPUs, memories, or gate arrays receive numerous control signals. Some of the control signals have information for controlling the integrated chips at a transition point of the logic level of a control signal. Among the signals having the information at the transition point (that is, an edge) of the logic level, there is an on-die termination signal ODT, which will be first described.

FIG. 1 is a diagram illustrating parts related to an on-die termination signal in a conventional memory device.

Referring to FIG. 1, the memory device includes a buffer 110, a latency control circuit 120, and an impedance matching circuit 130.

The buffer 110 receives an on-die termination signal ODT input to an ODT PAD. The on-die termination signal ODT is applied from a memory controller to the memory device to control on/off of the impedance matching circuit 130.

The latency control circuit 120 turns on/off the impedance matching circuit 130 using the on-die termination signal ODT input through the buffer 110. The latency control circuit 120 operates in synchronization with a clock CLK. The latency control circuit 120 turns on the impedance matching circuit 130 after a predetermined clock (a clock corresponding to a latency setting value of a termination operation) from a time point (a rising edge) at which the on-die termination signal ODT has been changed from a 'low' level to a 'high' level, and turns off the impedance matching circuit 130 after a predetermined clock from a time point (a falling edge) at which the on-die termination signal ODT has been changed from a 'high' level to a 'low' level.

The impedance matching circuit 130 is turned on/off under the control of the latency control circuit 120. The impedance matching circuit 130 has a predetermined impedance value, and performs an operation of matching the impedance of a data pad DQ when the impedance matching circuit 130 is turned on.

FIG. 2 is a diagram illustrating a level of the on-die termination signal ODT and turn on/off time points of the impedance matching circuit 130.

Referring to FIG. 2, the impedance matching circuit 130 is turned on after predetermined latency from a time point when the level of the on-die termination signal ODT has been changed from 'low' to 'high'. Then, the impedance matching circuit 130 is turned off after predetermined latency from a time point when the level of the on-die termination signal ODT has been changed from 'high' to 'low'.

Turning on/off of the impedance matching circuit 130 is based on the transition of the on-die termination signal ODT. The rising edge of the on-die termination signal ODT has information indicating when the impedance matching circuit 130 should be turned on, and the falling edge of the on-die termination signal ODT has information indicating when the impedance matching circuit 130 should be turned off. For a time period when there is no transition of the on-die termination signal ODT, there is no change in the impedance matching circuit 130.

SUMMARY

Exemplary embodiments of the present invention are directed to reduce current, which is required to control circuitry, with a control signal having information at a logic level transition time point, that is, an edge.

In accordance with an embodiment of the present invention, an integrated circuit may include a clock control signal generation circuit configured to generate a clock control signal using transition of a control signal, a clock control unit configured to activate a control clock in an activated period of the clock control signal, and to deactivate the control clock in a deactivated period of the clock control signal, and a control circuit configured to operate in response to the control signal and in synchronization with the control clock.

The clock control signal generation circuit may include a transition detection section configured to detect transition of the control signal, and a time setting section configured to deactivate the clock control signal when the transition of the control signal is not detected by the transition detection section for a predetermined time, and to activate the clock control signal when the transition of the control signal is detected. Furthermore, the control signal has information for the control circuit at a transition point.

In accordance with another embodiment of the present invention, an integrated circuit generating a control clock of a control circuit operable in response to a control signal, may include a clock control signal generation circuit configured to generate a clock control signal that is dependent on the transition of the control signal for an activation, and a clock control unit configured to generate the control clock that stays active during the activated period of the clock control signal.

In accordance with another embodiment of the present invention, a method for operating an integrated circuit includes detecting transition of a control signal, deactivating a clock control signal when the transition of the control signal is not detected for a predetermined time, and activating the clock control signal when the transition of the control signal is detected, activating a control clock in an activated period of the clock control signal and deactivating the control clock in a deactivated period of the clock control signal, and performing an operation in response to the control signal in synchronization with the control clock.

In accordance with another embodiment of the present invention, a method for operating an integrated circuit generating a control clock of a control circuit operable in response to a control signal, may include generating a clock control signal that is dependent on the transition of the control signal for an activation, and generating the control clock which stays active during the activated period of the clock control signal.

According to the embodiments of the present invention, a clock, which is input to a control circuit operating by receiving a control signal, is activated for a predetermined period from a transition time point of the control signal. Consequently, the control circuit consumes current in a period in which the control signal has information, and wasteful current consumption of the control circuit in other periods may be substantially prevented.

DETAILED DESCRIPTION

Figure 1:
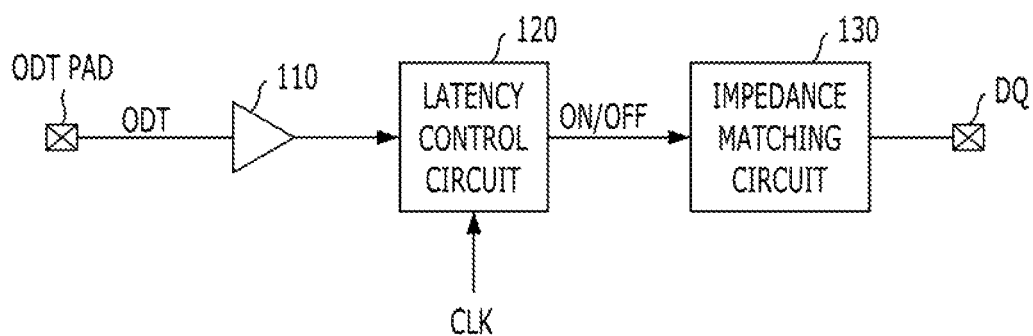
FIG. 1 is a diagram illustrating parts related to an on-die termination signal in a conventional memory device.
Figure 2:
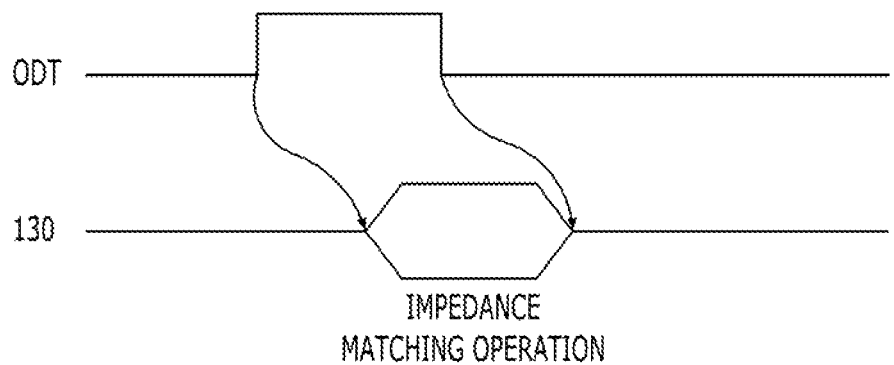
FIG. 2 is a diagram illustrating a level of an on-die termination signal ODT and turn on/off time points of an impedance matching circuit 130.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. In addition, a singular form may include a plural form as long as it is not specifically mentioned in a sentence FIG. 3 is a configuration diagram of an integrated circuit in accordance with an embodiment of the present invention.

Figure 3:
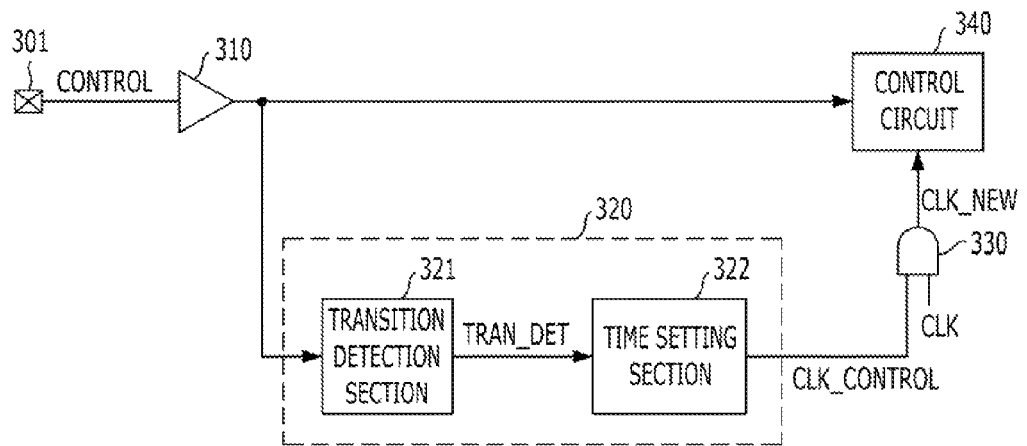
FIG. 3 is a configuration diagram of an integrated circuit in accordance with an embodiment of the present invention.

Referring to FIG. 3, the integrated circuit in accordance with the present invention includes a buffer 310, a clock control signal generation circuit 320, a clock control circuit 330, and a control circuit 340.

The buffer 310 is configured to receive a control signal CONTROL that is input from an external source of the integrated circuit through a pad 301. The control signal CONTROL has information at a transition point. There are various types of such a control signal CONTROL. When the integrated circuit is a memory device, an on-die termination signal ODT, a clock enable signal CKE and the like may be the control signal CONTROL. In the embodiment of FIG. 3, the control signal is input from the external source of the integrated circuit through the buffer 310. However, this is for illustrative purposes only. For example, the control signal CONTROL may be a signal that is generated in the integrated circuit and has information at a transition point.

The clock control signal generation circuit 320 is configured to generate a clock control signal CLK_CONTROL based on the transition of the control signal CONTROL. The clock control signal generation circuit 320 is configured to activate the clock control signal CLK_CONTROL for a predetermined time from the time point at which the logic level of the control signal CONTROL has been changed, and to deactivate the clock control signal CLK_CONTROL for times other than the predetermined time. The clock control signal generation circuit 320 includes a transition detection section 321 configured to detect the transition of the control signal CONTROL, and a time setting section 322. The time setting section 322 is configured to deactivate the clock control signal CLK_CONTROL when the transition of the control signal CONTROL is not detected by the transition detection section 321 for a predetermined time, and to activate the clock control signal CLK_CONTROL when the transition of the control signal CONTROL is detected during the predetermined time.

The clock control circuit 330 is configured to activate (toggle) a control clock CLK_NEW in an activated period of the clock control signal CLK_CONTROL, and to deactivate the control clock CLK_NEW (e.g. to fix the control clock CLK_NEW at a predetermined logic level) in a deactivated period of the clock control signal CLK_CONTROL. Consequently, the control clock CLK_NEW is activated for a predetermined time from the time point at which the logic level of the control signal CONTROL has been changed. As illustrated in FIG. 3, the clock control circuit 330 may include an AND gate configured to receive a clock CLK and the clock control signal CLK_CONTROL to output the control clock CLK_NEW.

The control circuit 340 is configured to operate in synchronization with the control clock CLK_NEW and perform a control operation according to the control signal CONTROL. For example, when the control signal CONTROL is a signal for instructing the execution of a specific operation, the control circuit 340 performs the specific operation in synchronization with the control clock CLK_NEW.

According to the present invention, the control clock CLK_NEW input to the control circuit 340 is activated for a predetermined period from the time point of a transition of the control signal CONTROL. Consequently, the control circuit 340 operates, according to the control clock CLK_NEW in a period in which the control circuit 340 may perform an operation in response to the control signal CONTROL, and the control circuit 340 does not need to perform operation in other period when the control clock CLK_NEW is deactivated, so that the wasteful current consumption is suppressed.

Figure 4:
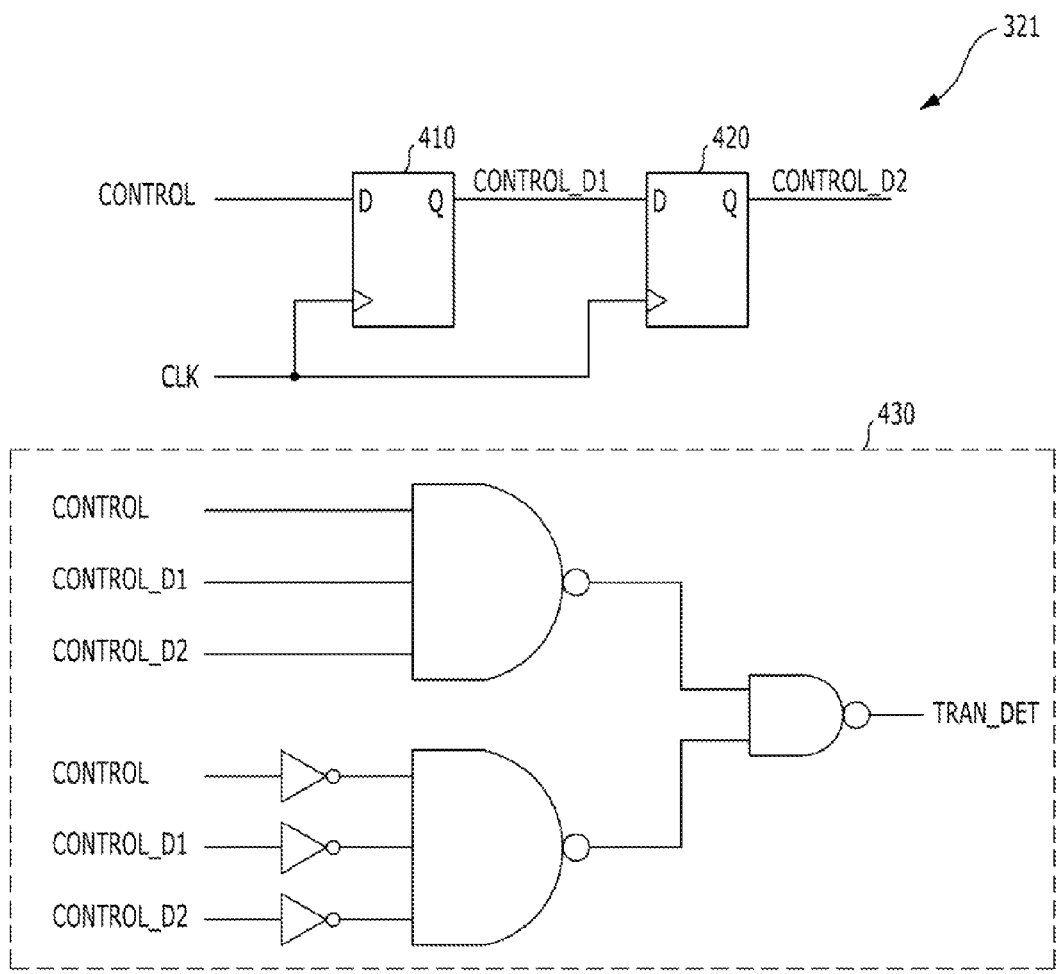
FIG. 4 is a configuration diagram of a transition detection section 321 of FIG. 3 in accordance with an embodiment.

FIG. 4 is a configuration diagram of the transition detection section 321 of FIG. 3 in accordance with an embodiment.

Referring to FIG. 4, the transition detection section 321 includes one or more shift parts 410 and 420 and a detection signal generation part 430.

The one or more shift parts 410 and 420 are configured to sequentially delay the control signal CONTROL in synchronization with the clock CLK and to generate delayed control signals CONTROL_D1 and CONTROL_D2. Each of the shift parts 410 and 420 may include a D flip-flop.

The detection signal generation part 430 is configured to receive the control signal CONTROL and the delayed control signals CONTROL_D1 and CONTROL_D2, and to generate a transition detection signal TRAN_DET. When the levels of the control signal CONTROL and the delayed control signals CONTROL_D1 and CONTROL_D2 are substantially equal to one another, that is, when (CONTROL=H, CONTROL and CONTROL_D2=11) or (CONTROL=L, CONTROL_D1=L and CONTROL_D2=L), the detection signal generation part 430 deactivates the transition detection signal TRAN_DET to a 'high' level. Otherwise, the detection signal generation part 430 activates the transition detection signal TRAN_DET to a 'low' level. The transition detection signal TRAN_DET at a 'high' level represents that there is no transition of the control signal CONTROL, and the transition detection signal TRAN_DET at a 'low' level represents that there is the transition of the control signal CONTROL.

FIG. 4 illustrates an example in which the delayed control signals CONTROL_D1 and CONTROL_D2 are generated using the shift parts 410 and 420 operating in synchronization with the clock CLK. However, the delayed control signals CONTROL_D1 and CONTROL_D2 may be generated using delay lines instead of the shift parts 410 and 420. Furthermore, FIG. 4 illustrates an example in which the clock CLK is input to the shift parts 410 and 420. However, instead of the clock CLK, the control clock CLK_NEW may be used in a part (particularly, a shift part of a rear stage) of the shift parts 410 and 420.

Figure 5:
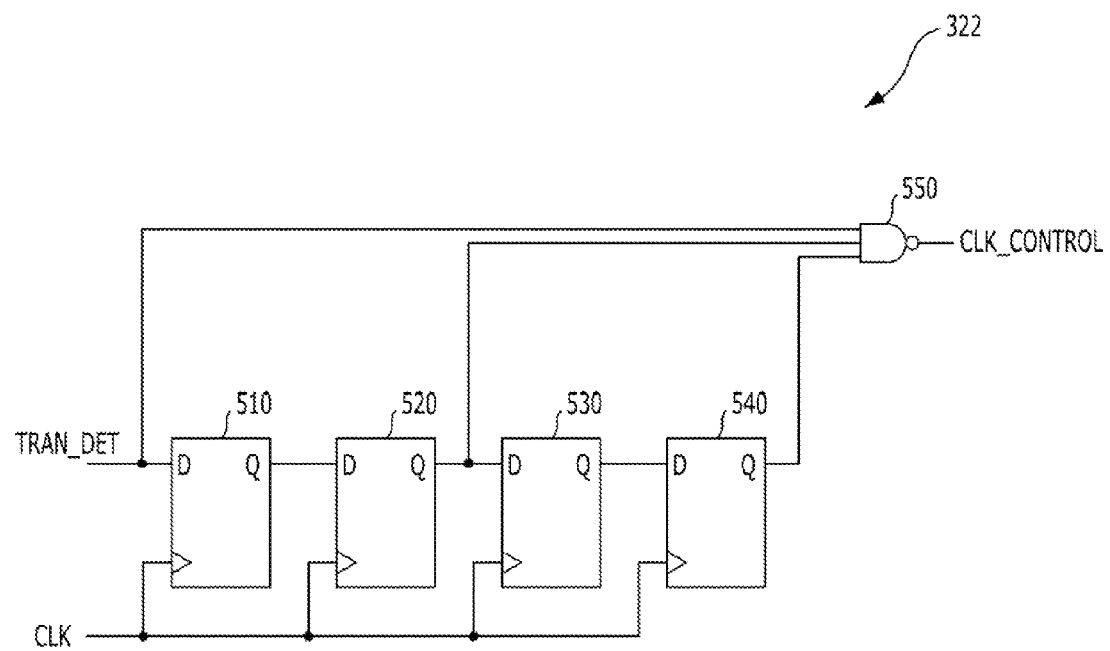
FIG. 5 is a configuration diagram of a time setting section 322 of FIG. 3 in accordance with an embodiment.

FIG. 5 is a configuration diagram illustrating the time setting section 322 of FIG. 3 in accordance with an embodiment.

Referring to FIG. 5, the time setting section 322 includes one or more shift parts 510, 520, 530, and 540 and a logic part 550.

The one or more shift parts 510, 520, 530, and 540 are configured to be serially connected to one another and sequentially shift the transition detection signal TRAN_DET in synchronization with the clock CLK. Each of the shift parts 510, 520, 530, and 540 may include a D flip-flop.

The logic part 550 is configured to use the transition detection signal TRAN_DET and output A and B of the shift parts 520 and 540 as input, and to deactivate the clock control signal CLK_CONTROL to a 'low' level when the input signals TRAN_DET, A, and B have a 'high' level while activating the clock control signal CLK_CONTROL to a 'high' level in other cases. As a consequence, when the transition detection signal TRAN_DET substantially maintains a deactivated state (logic level of 'high') for four clocks (e.g. when there is no transition of the control signal CONTROL), the logic part 550 deactivates the clock control signal CLK_CONTROL to a 'low' level. The logic part 550 may include a NAND gate as illustrated in FIG. 5.

The number of the shift parts determines duration that the clock control signal CLK_CONTROL maintains activated state. As the number of the shift parts increase, the duration of the clock control signal CLK_CONTROL activated also increases.

FIG. 5 illustrates an example in which the clock CLK is input to the shift parts 510, 520, 530, and 540. However, instead of the clock CLK, the control clock CLK_NEW may be used in the shift parts 510, 520, 530, and 540.

Figure 6:
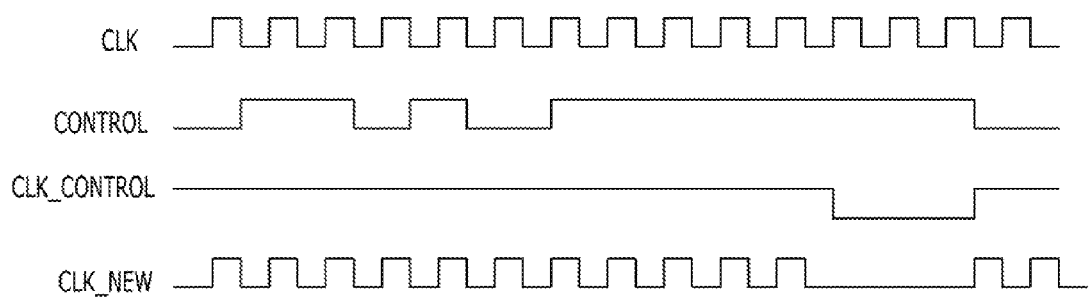
FIG. 6 is a diagram illustrating the operations of a clock control signal generation circuit 320 and a clock control circuit 330 described in FIG. 3 to FIG. 5.

FIG. 6 is a diagram illustrating the operations of the clock control signal generation circuit 320 and the clock control circuit 330 described in FIG. 3 to FIG. 5.

Referring to FIG. 6, when there is no transition of the control signal CONTROL for five clocks, the clock control signal CLK_CONTROL is deactivated to a 'low' level, and the control clock CLK_NEW is deactivated during the clock control signal CLK_CONTROL stays deactivated at a level. During the clock control signal CLK_CONTROL stays activated to a 'high' level, the control clock CLK_NEW is activated.

Figure 7:
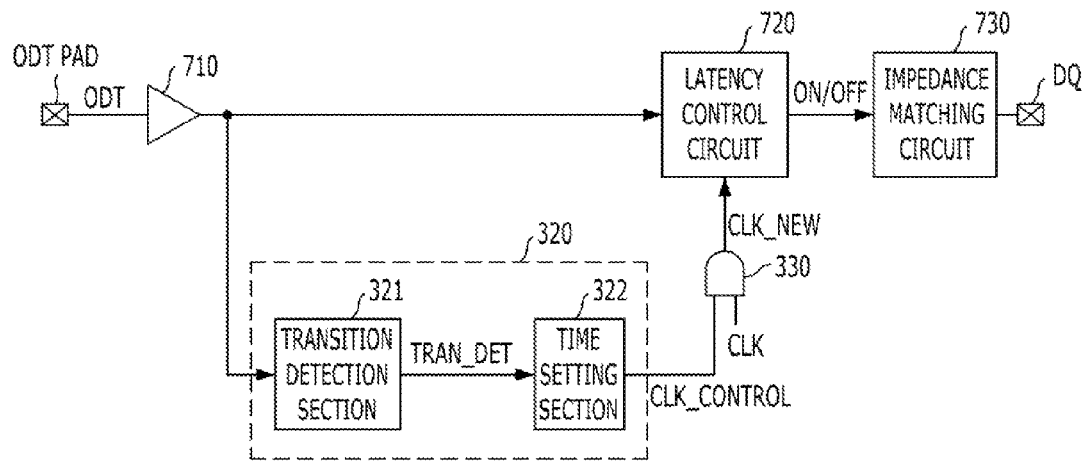
FIG. 7 is a diagram illustrating an example in which the embodiment of the present invention is applied to parts related to control of an on-die termination signal ODT in a memory device.

FIG. 7 is a diagram illustrating an example in which the embodiment of the present invention is applied to parts related to control of an on-die termination signal ODT in a memory device.

Referring to FIG. 7, the memory device includes a buffer 710, a clock control signal generation circuit 320, a clock control circuit 330, a latency control circuit 720, and an impedance matching circuit 730.

The buffer 710 is configured to receive an on-die termination signal ODT that is input to an ODT PAD. The on-die termination signal ODT is a control signal, which is applied from a memory controller to the memory device in order to control on/off of the impedance matching circuit 730.

The clock control signal generation circuit 320 is configured to generate the clock control signal CLK_CONTROL using a period in which the logic level of the on-die termination signal ODT is changed. The clock control signal generation circuit 320 is configured to activate the clock control signal CLK_CONTROL for a predetermined time from the time point at which the on-die termination signal ODT has been changed, and to deactivate the clock control signal CLK_CONTROL for times other than the predetermined time. Since the clock control signal generation circuit 320 has substantially the same configuration as the clock control signal generation circuit 320 described in FIG. 3 to FIG. 5, a detailed description thereof will be omitted.

The clock control circuit 330 is configured to activate the control clock CLK_NEW in an activated period of the clock control signal CLK_CONTROL, and to deactivate the control clock CLK_NEW in a deactivated period of the clock control signal CLK_CONTROL.

The latency control circuit 720 is configured to turn on/off the impedance matching circuit 730 using the on-die termination signal ODT input through the buffer 710. The latency control circuit 720 is configured to operate in synchronization with the control clock CLK_NEW, to turn on the impedance matching circuit 730 after a predetermined clock (a clock corresponding to a latency setting value of a termination operation) from a time point (a rising edge) at which the on-die termination signal ODT has been changed from a 'low' level to a 'high' level, and to turn off the impedance matching circuit 730 after a predetermined clock from a time point (a falling edge) at which the on-die termination signal ODT has been changed from a 'high' level to a 'low' level. Since the control clock CLK_NEW input to the latency control circuit 720 is activated in a period in which the operation of the latency control circuit 720 is required, the latency control circuit 720 operates in synchronization with the control clock CLK_NEW in a period in which control according to the on-die termination signal is required, and the wasteful current consumption is suppressed in other periods. The latency control circuit 720 does not change the on/off state of the impedance matching circuit 730 for a deactivated period of the control clock CLK_NEW, and continuously maintains a previous state.

The impedance matching circuit 730 is configured to be turned on/off under the control of the latency control circuit 720. The impedance matching circuit 730 has a predetermined impedance value, and performs an operation of matching the impedance of a data pad DQ when the impedance matching circuit 730 is turned on.

Figure 8:
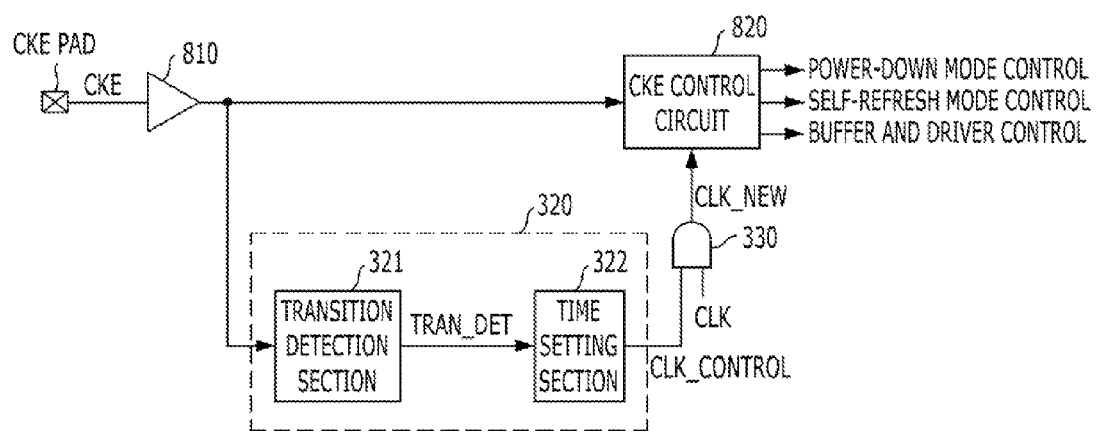
FIG. 8 is a diagram illustrating an example in which the embodiment of the present invention is applied to parts related to control of a clock enable signal CKE in a memory device.

FIG. 8 is a diagram illustrating an example in which the embodiment of the present invention is applied to parts related to control of a clock enable signal CKE in a memory device.

Referring to FIG. 8, the memory device includes a buffer 810, a clock control signal generation circuit 320, a clock control circuit 330, and a CKE control circuit 820.

The buffer 810 is configured to receive a clock enable signal CKE input to a CKE pad CKE PAD. The clock enable signal CKE is used to control activation or deactivation of a power-down mode, a self-refresh mode, various buffers, and an output driver. The clock enable signal CKE has information at a transition period similar to the on-die termination signal ODT.

The clock control signal generation circuit 320 is configured to generate the clock control signal CLK_CONTROL using a period in which the logic level of the clock enable signal CKE is changed. The clock control signal generation circuit 320 is configured to activate the clock control signal CLK_CONTROL for a predetermined time from the time point at which the clock enable signal CKE has been changed, and to deactivate the clock control signal CLK_CONTROL for times other than the predetermined time. Since the clock control signal generation circuit 320 has substantially the same configuration as the clock control signal generation circuit 320 described in FIG. 3 to FIG. 5, a detailed description thereof will be omitted.

The clock control circuit 330 is configured to activate the control clock CLK_NEW in an activated period of the clock control signal CLK_CONTROL, and to deactivate the control clock CLK_NEW in a deactivated period of the clock control signal CLK_CONTROL.

The CKE control circuit 820 is configured to perform a power down mode control operation and a self-refresh mode control operation, which are related to the clock enable signal CKE, and an on/off control operation of the buffers and the output driver, by using the clock enable signal input through the buffer 810. The CKE control circuit 820 operates in synchronization with the control clock CLK_NEW. Since the control clock CLK_NEW input to the CKE control circuit 820 is activated in a period in which the operation of the CKE control circuit 820 is required, the CKE control circuit 820 operates in synchronization with the control clock CLK_NEW in a period in which control related to the clock enable signal is required, and the wasteful current consumption is suppressed in other periods.

While the present invention has been described with respect to the specific embodiments, it will be apparent to those skilled in the art that various changes and modifications may be made without departing from the spirit and scope of the invention as defined in the following claims.

What is claimed is:

1. An integrated circuit comprising:
   a transition detection section configured to detect transition of a control signal;
   a time setting section configured to deactivate the clock control signal when the transition of the control signal is not detected by the transition detection section for a predetermined time, and to activate the clock control signal when the transition of the control signal is detected;
   a clock control unit configured to activate a control clock in an activated period of the clock control signal, and to deactivate the control clock in a deactivated period of the clock control signal; and
   a control circuit configured to operate in response to the control signal and in synchronization with the control clock.

2. The integrated circuit of claim 1, wherein the control signal has information for the control circuit in a transition period.

3. The integrated circuit of claim 1, wherein the integrated circuit is a memory device, the control signal is an on-die termination signal, and the control circuit is a circuit configured to control on/off of an impedance matching circuit in response to the on-die termination signal.

4. The integrated circuit of claim 1, wherein the integrated circuit is a memory device, the control signal is a clock enable signal, and the control circuit is a circuit configured to activate or deactivate circuits in the memory device in response to the clock enable signal.

5. The integrated circuit of claim 1, wherein the transition detection section is configured to generate two or more signals by delaying the control signal, to deactivate a transition detection signal when logic values of the generated signals are substantially equal to one another, and to activate the transition detection signal when the logic values of at least one of the generated signals are different from one another.

6. The integrated circuit of claim 5, wherein the time setting section comprises:
   one or more shifting parts configured to be serially connected to one another and to sequentially shift the transition detection signal; and
   a logic part configured to generate the clock control signal in response to an output signal of at least one of the one or more shifting parts and the transition detection signal.

7. A method for operating an integrated circuit, comprising:
   detecting transition of a control signal;
   deactivating a clock control signal when the transition of the control signal is not detected for a predetermined time, and activating the clock control signal when the transition of the control signal is detected;
   activating a control clock in an activated period of the clock control signal and deactivating the control clock in a deactivated period of the clock control signal; and
   performing an operation in response to the control signal in synchronization with the control clock.

8. The method of claim 7, wherein the control signal has information for the operation in a transition period.

9. The method of claim 7, wherein the integrated circuit is a memory device, the control signal is an on-die termination signal, and the control operation is an operation for controlling on/off of an impedance matching circuit in response to the on-die termination signal.

10. The method of claim 7, wherein the integrated circuit is a memory device, the control signal is a clock enable signal, and the control operation is an operation for activating or deactivating circuits in the memory device in response to the clock enable signal.

11. An integrated circuit generating a control clock of a control circuit operable in response to a control signal, comprising:
   a clock control signal generation circuit configured to generate a clock control signal that is dependent on the transition of the control signal for an activation; and
   a clock control unit configured to generate the control clock which stays active during the activated period of the clock control signal,
   wherein, the clock control signal generation circuit deactivates the clock control signal when there is no transition of the control signal for a predetermined time, and activates the clock control signal when there is a transition of the clock control signal.

12. The integrated circuit of claim 11, wherein the integrated circuit is a memory device.

13. The integrated circuit of claim 12, wherein the control signal is an on-die termination signal.

14. The integrated circuit of claim 13, wherein the control circuit is a circuit configured to control on/off of an impedance matching circuit in response to the on-die termination signal.

15. The integrated circuit of claim 12, wherein the control signal is a clock enable signal.

16. The integrated circuit of claim 15, wherein the control circuit is a circuit configured to activate or deactivate circuits in the memory device in response to the clock enable signal.

* * * * *